United States Patent
Isokawa (10) Patent No.: US 7,429,759 B2
(45) Date of Patent: Sep. 30, 2008

(54) OPTICAL SEMICONDUCTOR DEVICE WITH IMPROVED ILLUMINATION EFFICIENCY

(75) Inventor: Shinji Isokawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/559,447

(22) PCT Filed: Jun. 7, 2004

(86) PCT No.: PCT/JP2004/007930

§ 371 (c)(1),
(2), (4) Date: Dec. 2, 2005

(87) PCT Pub. No.: WO2004/112155

PCT Pub. Date: Dec. 23, 2004

(65) Prior Publication Data

US 2006/0163602 A1    Jul. 27, 2006

(30) Foreign Application Priority Data

Jun. 11, 2003    (JP)    ............................. 2003-166323

(51) Int. Cl.
*H01L 33/00* (2006.01)
(52) U.S. Cl. ............................. 257/100; 257/98; 257/99
(58) Field of Classification Search ........... 257/98–100, 257/E33.055–E33.059, E33.067, E33.068, 257/E33.072
See application file for complete search history.

(56) References Cited

U.S. PATENT DOCUMENTS

| | | | |
|---|---|---|---|
| 4,638,343 A * | 1/1987 | Althaus et al. | 257/98 |
| 6,274,890 B1 * | 8/2001 | Oshio et al. | 257/98 |
| 6,355,946 B1 | 3/2002 | Ishinaga | |
| 6,963,166 B2 * | 11/2005 | Yano et al. | 313/498 |

FOREIGN PATENT DOCUMENTS

| | | |
|---|---|---|
| JP | 8-8463 | 1/1996 |
| JP | 9-283803 | 10/1997 |
| JP | 10-294495 | 11/1998 |
| JP | 2000-183407 | 6/2000 |
| JP | 2001-36147 | 2/2001 |
| JP | 2001-298216 | 10/2001 |
| JP | 2002-368277 | 12/2002 |
| JP | 2003-46137 | 2/2003 |

* cited by examiner

*Primary Examiner*—Richard T. Elms
*Assistant Examiner*—Allison P Bernstein
(74) *Attorney, Agent, or Firm*—Hamre, Schumann, Mueller & Larson, P.C.

(57) ABSTRACT

An optical semiconductor device (A1) includes a light reflector (5) and an optical semiconductor chip (3). The reflector (5) includes two first reflecting surfaces (50a) spaced from each other in direction x, and two second reflecting surfaces (50b) spaced from each other in direction y. The chip (3) includes a rectangular upper surface and a rectangular lower surface spaced from each other in direction z perpendicular to both of the directions x and y. The chip (3) further includes at least one light-emitting surface (31) extending between the upper and the lower surfaces. The light-emitting surface (31) faces a corresponding one of the second reflecting surfaces (50b). The light-emitting surface (31) is non-parallel to the corresponding second reflecting surfaces (50b) as viewed in parallel to the direction z.

11 Claims, 12 Drawing Sheets

OPTICAL SEMICONDUCTOR DEVICE WITH IMPROVED ILLUMINATION EFFICIENCY

TECHNICAL FIELD

The present invention relates to an optical semiconductor device comprising an optical semiconductor chip such as a LED chip. The present invention especially relates to an optical semiconductor device comprising a reflector for improving illumination efficiency.

BACKGROUND ART

Figure 7:
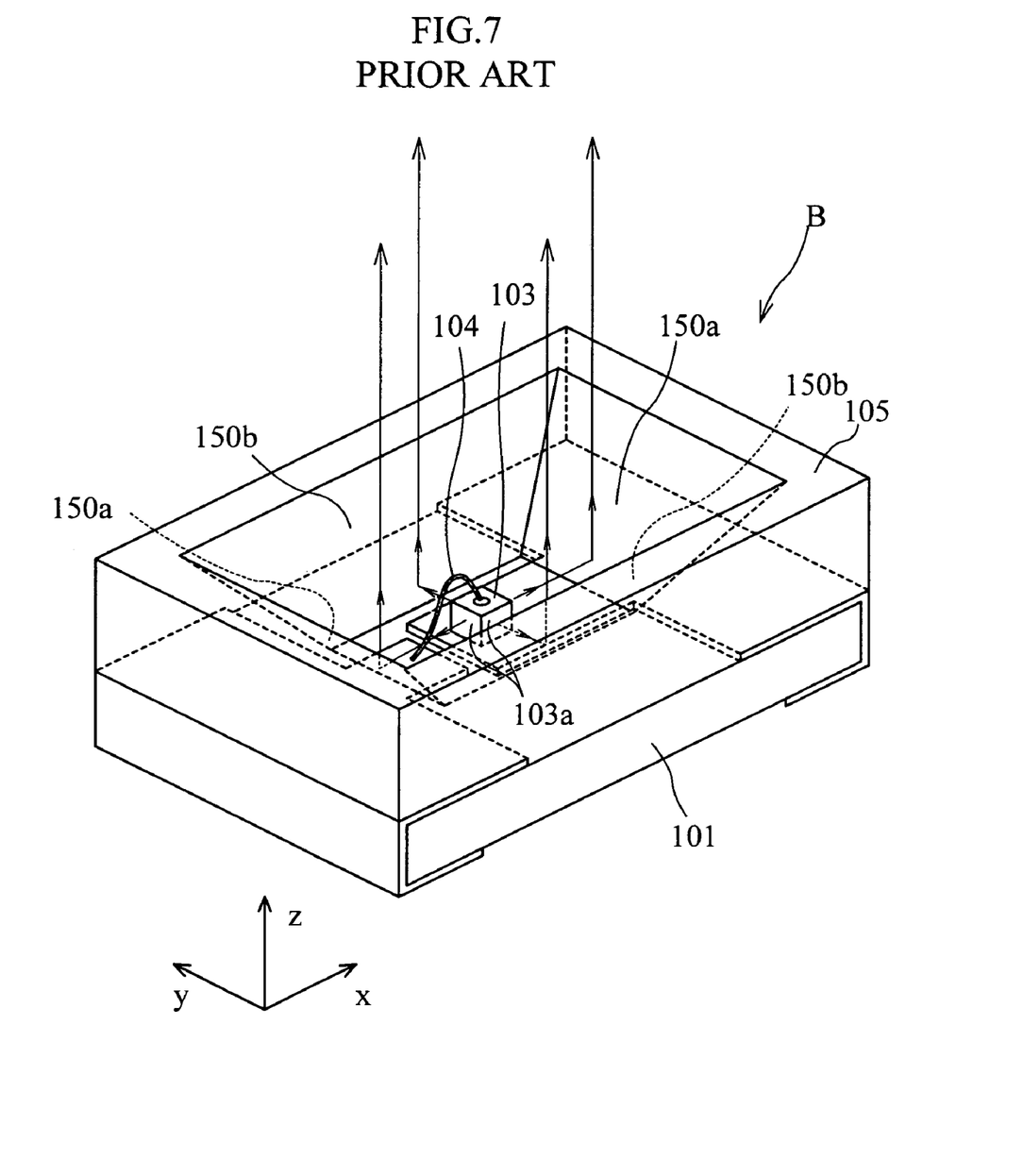
FIG. 7 is a perspective view illustrating a conventional optical semiconductor device.
Figure 8:
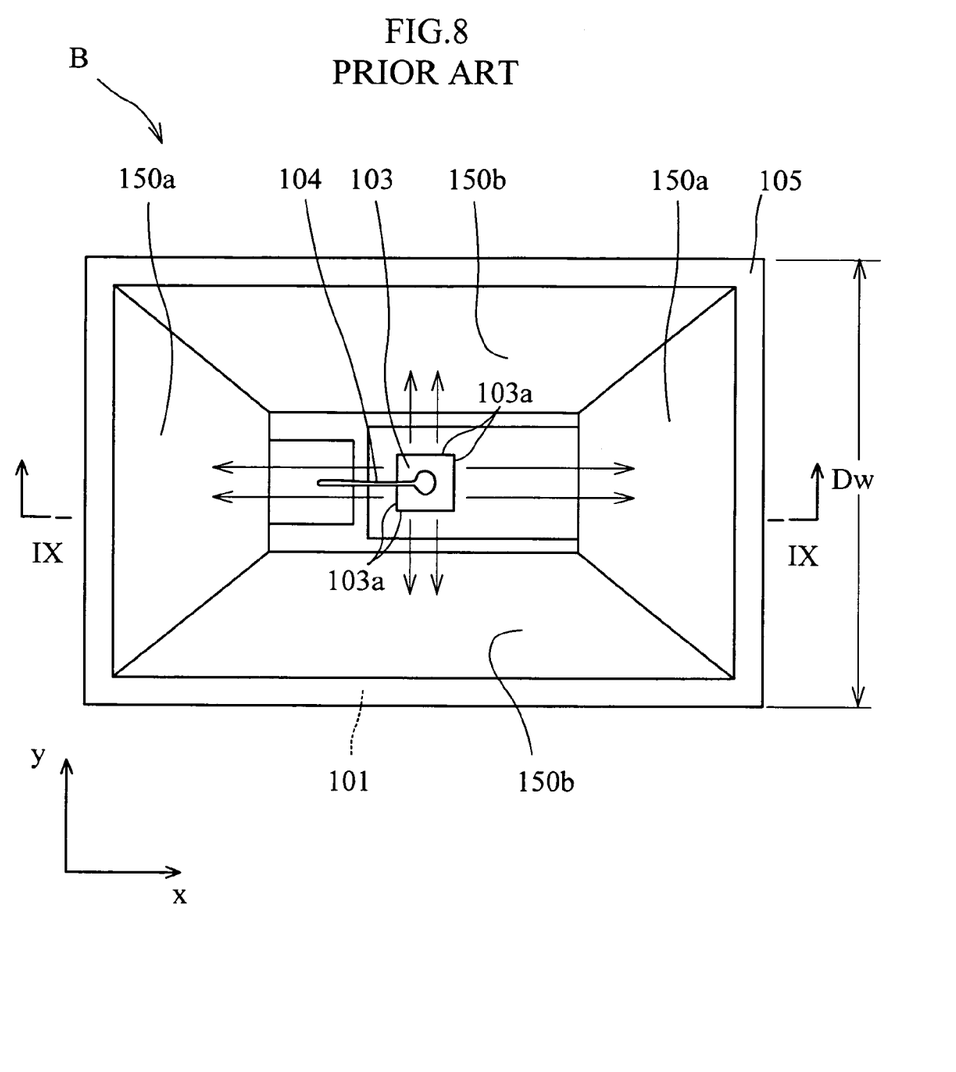
FIG. 8 is a plan view illustrating the conventional optical semiconductor device.
Figure 9:
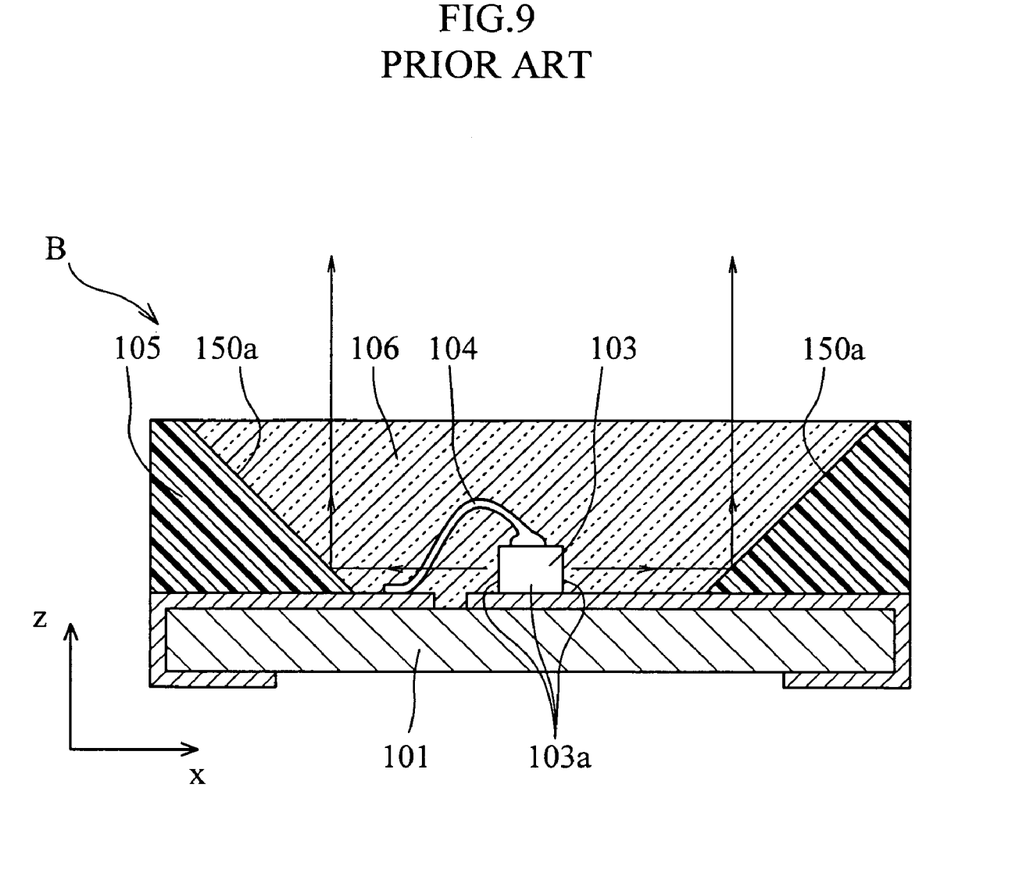
FIG. 9 is a sectional view taken along lines IX-IX in FIG. 8.

An example of a conventional optical semiconductor device is disclosed in a following patent document 1. FIGS. 7-9 illustrate the structure of this optical semiconductor device. The illustrated optical semiconductor device B includes a base plate 101, an LED chip 103 mounted on the base plate, and a reflector 105 surrounding the LED chip 103. As shown in FIG. 8, the reflector 105 is a rectangular frame. As shown in FIG. 9, a space defined by the reflector 105 is filled with a transparent protective resin 106 for covering the LED chip 103 and a wire 104 connected to the chip (the protective resin 106 is not shown in FIGS. 7 and 8). The reflector 105 includes two pairs of inner surfaces (reflecting surfaces) 150a, 150b for light reflection. The two reflecting surfaces 150a are spaced from each other in the direction x, and the reflecting surfaces 150a are parallel to the direction y perpendicular to the direction x. The other two reflecting surfaces 150b are spaced from each other in the direction y, and the reflecting surfaces 150b are parallel to the direction x. These four reflecting surfaces 150a, 150b are inclined relative to the direction z (which is perpendicular to both of the directions x and y). The inclined angle is 45°, for example. The LED chip 103 is a rectangular parallelepiped and includes four side surfaces 103a. Each of the side surfaces 103a faces a corresponding one of the four reflecting surfaces 150a, 150b, and is parallel to either the direction x or y.

Patent Document 1: JP-A-2000-183407

When a predetermined drive voltage is applied to the LED chip 103, light is emitted from the upper surface and the four side surfaces 103a of the chip. The light emitted from the upper surface directly irradiates an illuminated area placed in front of the chip 103 (above the chip 103 in FIG. 9). As shown in FIG. 9, the light emitted from the side surfaces 103a is upwardly reflected by the reflecting surfaces 150a or 150b, and then irradiates the illuminated area. Due to this structure, the illuminated area can be irradiated more efficiently than in a structure where light to be directed toward the illuminated area is emitted only from the upper surface of the chip 103.

Figure 10:
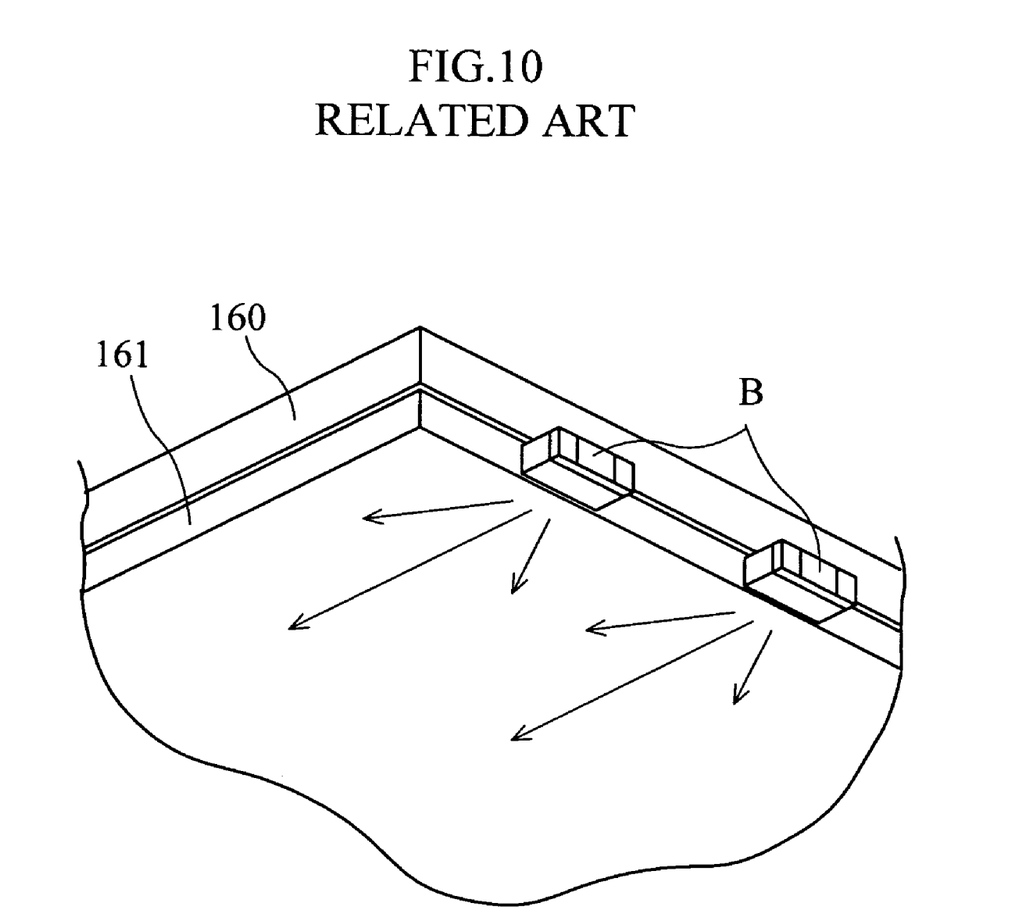
FIG. 10 is a perspective view illustrating an example of use of a conventional optical semiconductor device.
Figure 11:
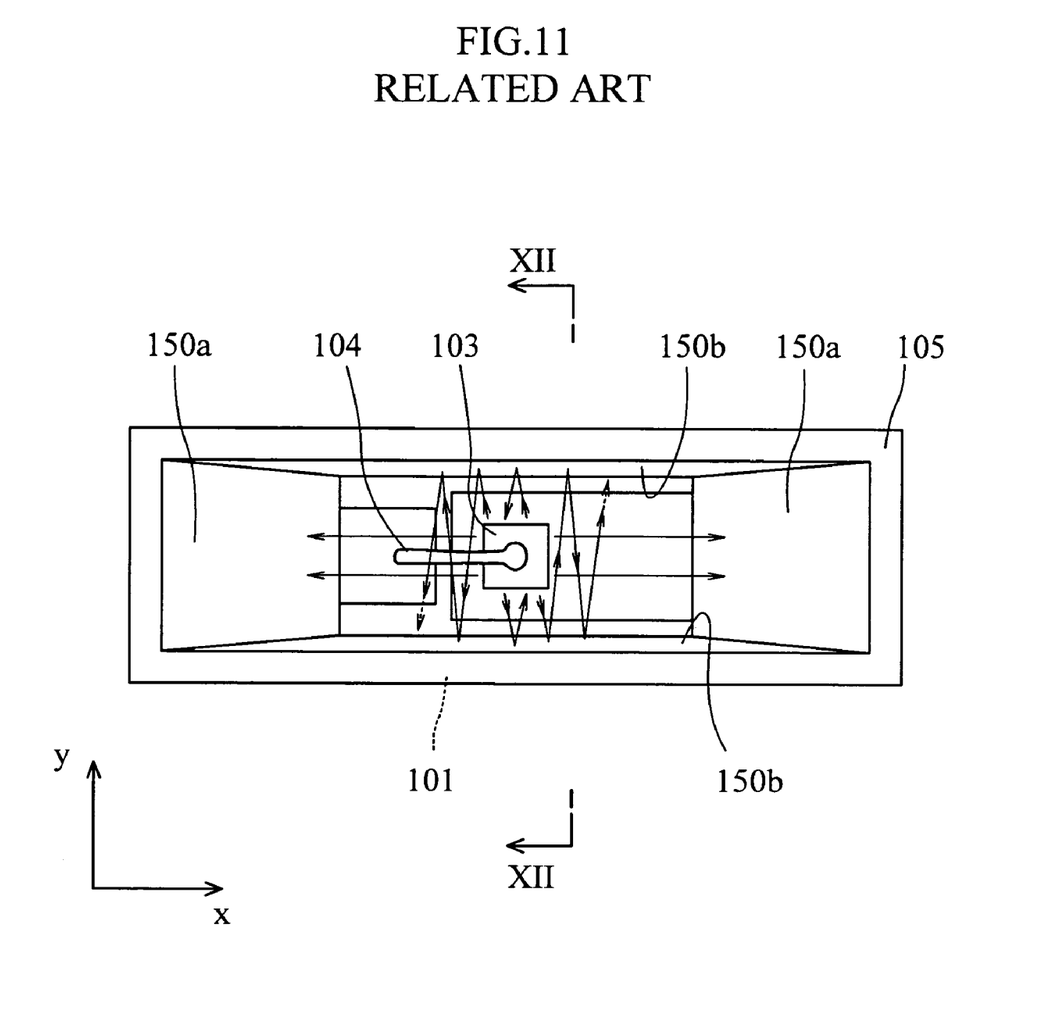
FIG. 11 is a plan view illustrating a related art of the present invention.

FIG. 10 illustrates the optical semiconductor device B used as a light source for backlighting a liquid crystal display. Specifically, the liquid crystal display includes a liquid crystal panel 160 and a light guiding plate 161 provided behind the panel (below the panel in FIG. 10) The optical semiconductor device B faces and is attached to one side surface of the light guiding plate 161. With this arrangement, the width Dw (see FIG. 8) of the optical semiconductor device B needs to be almost the same as (or smaller than) the thickness of the light guiding plate 161, so that the light emitted from the optical semiconductor device B is properly guided into the light guiding plate 161. Thus, when the thickness of the light guiding plate 161 is small, the width of the optical semiconductor device B and consequently the width of the reflector 105 need to be correspondingly small as shown in FIG. 11. However, in such a case, following problem may be caused.

Figure 12:
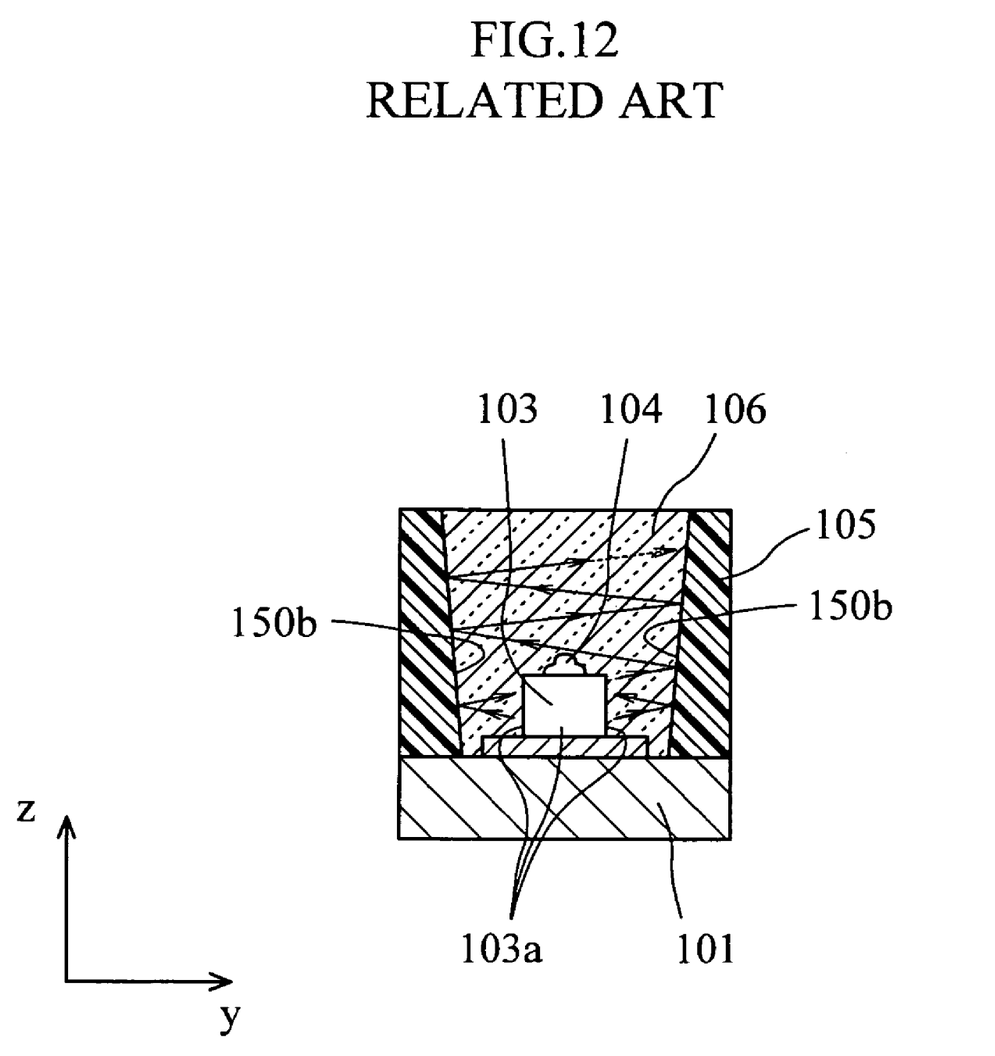
FIG. 12 is a sectional view taken along lines XII-XII in FIG. 11.

Specifically, when the width of the reflector 105 is small, the inclined angle of the reflecting surfaces 150b can not be made large. Therefore, as shown in FIG. 12, the light emitted laterally from the LED chip 103 does not travel vertically upward by only one reflection at one of the reflecting surfaces 150b, but repeats reflection at two reflecting surfaces 150b and shifts upward gradually. As it is technically difficult to obtain a 100% optical reflectivity at the reflecting surfaces 150b, the light may be attenuated due to the repeated reflection. As a result, the luminance of light emission at the optical semiconductor device may be reduced.

DISCLOSURE OF THE INVENTION

The present invention has been conceived under the above-described circumstances. It is therefore an object of the present invention to provide an optical semiconductor device able to obtain a suitable luminance of light emission by reducing the above-described light attenuation.

An optical semiconductor device according to the present invention comprises: a light reflector including two first reflecting surfaces spaced from each other in direction x and two reflecting surfaces spaced from each other in direction y perpendicular to the direction x; and at least one optical semiconductor chip arranged between the two first reflecting surfaces and also between the two second reflecting surfaces. The optical semiconductor chip includes a rectangular upper surface and a rectangular lower surface spaced to each other in direction z perpendicular to both of the directions x and y, and further includes at least one light-emitting surface extending between the upper surface and the lower surface. The first reflecting surfaces are inclined relative to the direction z at a first inclined angle, so that light emitted from the optical semiconductor chip is reflected in the direction z. The second reflecting surfaces are inclined relative to the direction z at a second inclined angle that is smaller than the first inclined angle. The light-emitting surface of the optical semiconductor chip faces one of the second reflecting surfaces and is non-parallel to the facing second reflecting surface as viewed parallel to the direction z.

The structure can reflect the light, that is emitted from the light-emitting side surfaces of the optical semiconductor device and is directed to the second reflecting surfaces, toward the first reflecting surface. Therefore, the light is prevented from repeated reflection at the two second reflecting surfaces, thereby preventing the light attenuation.

Preferably, the light-emitting surface of the optical semiconductor chip is non-parallel to both of the directions x and y.

Preferably, the light-emitting surface of the optical semiconductor chip is inclined relative to the direction x at 45°.

Preferably, the above-described one of the two second reflecting surfaces is non-parallel to both of the directions x and y.

Preferably, the reflector is a rectangular frame elongated in the direction x longer than in the direction y.

Preferably, the optical semiconductor device according to the present invention further comprises a second optical semiconductor chip arranged between the two first reflecting surfaces and also between the two second reflecting surfaces. The above-described one optical semiconductor chip and the second optical semiconductor chip are spaced from each other in the direction x.

Preferably, the optical semiconductor device according to the present invention further comprises a base plate for mounting the optical semiconductor chip and the reflector. A wiring pattern is formed on the base plate and is electrically connected to the optical semiconductor chip.

Preferably, each of the upper surface and the lower surface of the optical semiconductor chip is square and the optical semiconductor chip includes four rectangular light-emitting surfaces extending between the upper and the lower surfaces. The upper surface of the chip has two diagonals. One of the diagonals is parallel to the direction x, while the other diagonal being parallel to the direction y.

Preferably, the light emitted from the four light-emitting surfaces is partly reflected by the second reflecting surfaces and then travels toward the first reflecting surfaces. On the other hand, the above light partly travels directly to the first reflecting surfaces.

The second inclined angle of the second reflecting surfaces is 0°. Accordingly, the first reflecting surfaces are rectangular.

Other features and advantages will be apparent from the following description of the embodiments with reference to the accompanying drawings.

BEST MODE FOR CARRYING OUT THE INVENTION

Preferred embodiments of the present invention are described below with reference to the accompanying drawings.

Figure 1:
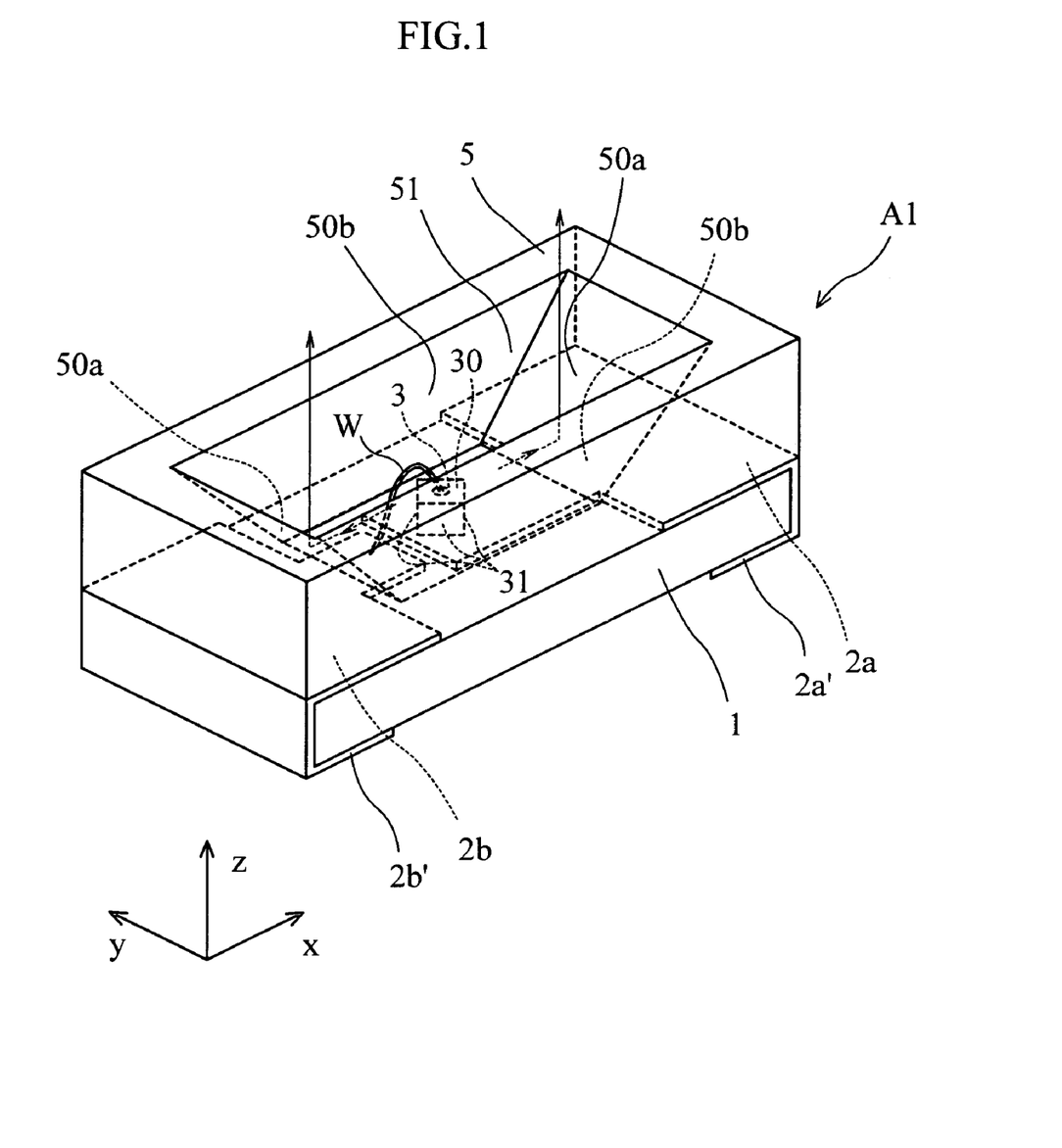
FIG. 1 is a perspective view illustrating an optical semiconductor device according to a first embodiment of the present invention.
Figure 2:
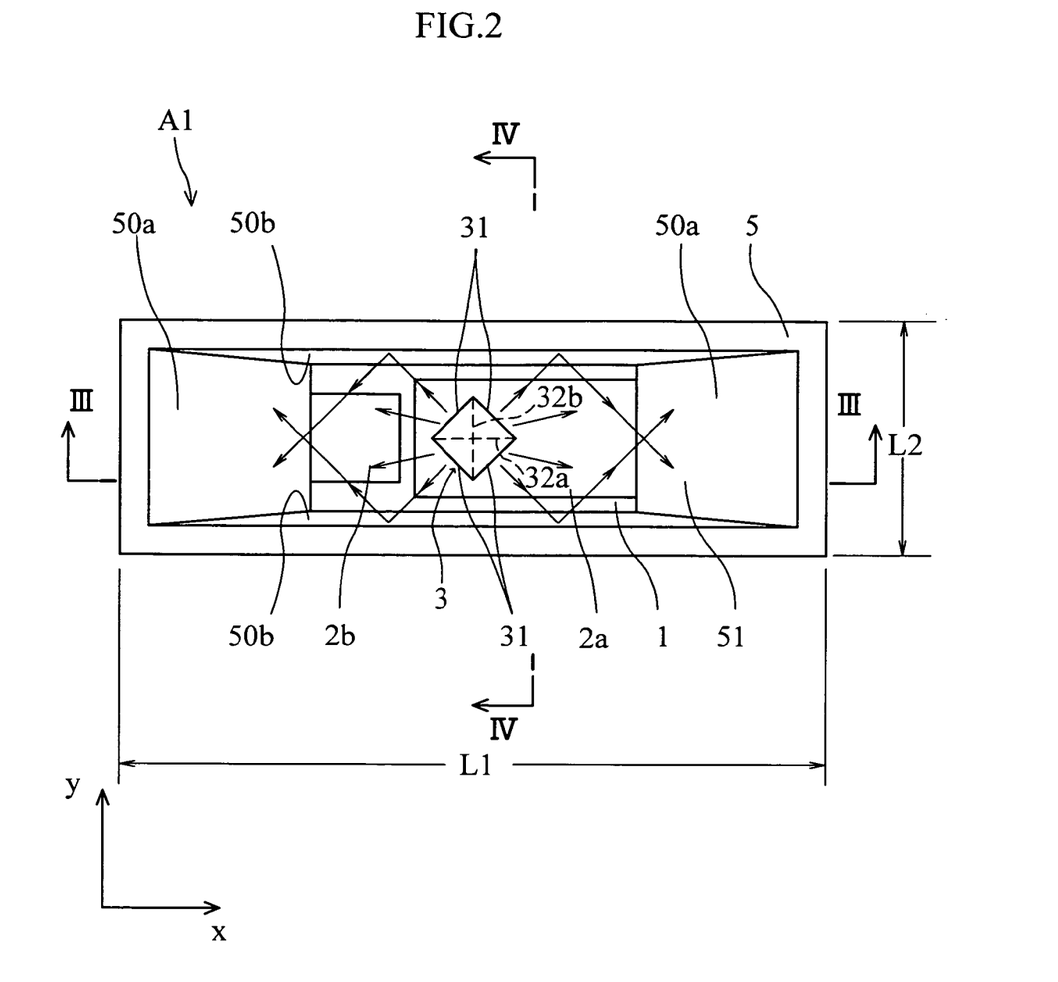
FIG. 2 is a plan view illustrating the optical semiconductor device.
Figure 3:
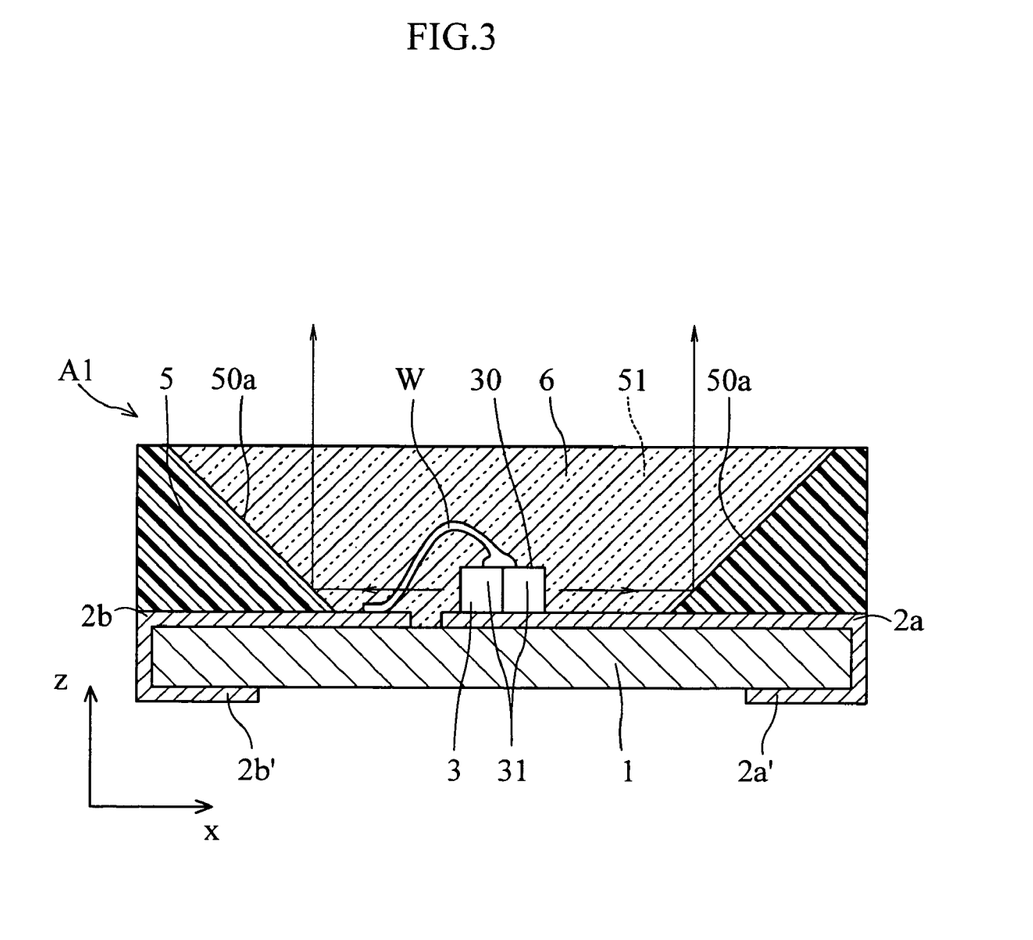
FIG. 3 is a sectional view taken along lines III-III in FIG. 2.
Figure 4:
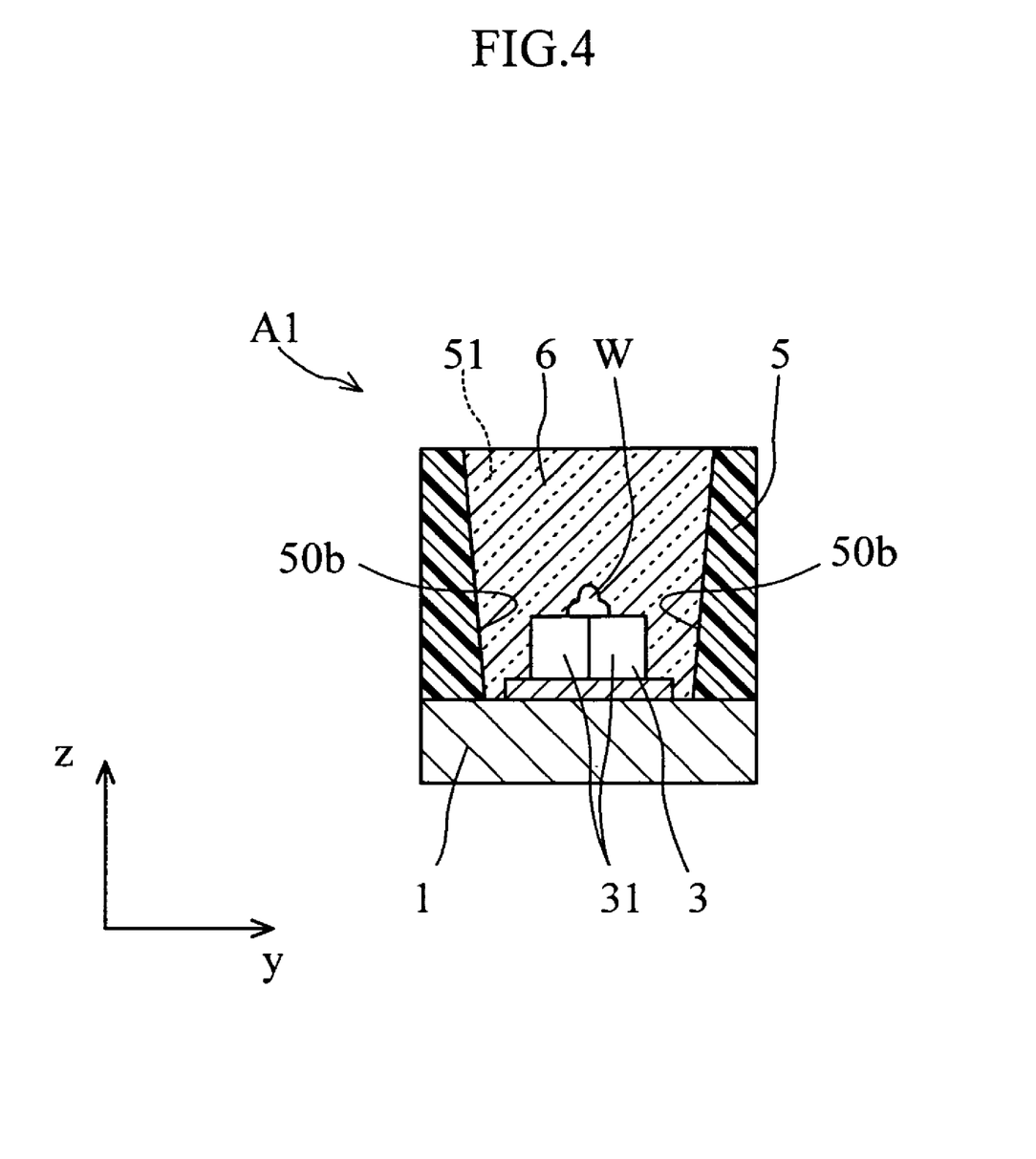
FIG. 4 is a sectional view taken along lines IV-IV in FIG. 2.

FIGS. 1-4 illustrate an optical semiconductor device A1 according to a first embodiment of the present invention. In FIG. 1, a coordinate system is set along the directions x, y, and z, relative to the optical semiconductor device A1. Each of the three directions is perpendicular to the other two directions, and the direction z is the vertical direction of the device (the arrangement is the same for other embodiments). FIG. 2 shows the optical semiconductor device A1 viewed in the direction z (or viewed parallel to the direction z) from a viewpoint above the optical semiconductor device A1. FIG. 3 is a sectional view taken along lines III-III in FIG. 2, and FIG. 4 is a sectional view taken along lines IV-IV in FIG. 2.

The optical semiconductor device A1 includes a rectangular insulating base plate 1, an LED chip 3, a reflector 5, and a light-permeable member 6. The light-permeable member 6 is not shown in FIGS. 1 and 2.

The base plate 1 is made of a glass epoxy resin, for example. The base plate 1 includes an upper surface on which the LED chip 3, the reflector 5, and the light-permeable member 6 are mounted.

The LED chip 3 includes a square upper surface 30, a lower surface, and four rectangular side surfaces 31. The upper surface 30 and the lower surface are spaced from each other in the direction z. The four side surfaces 31 are elongated between the upper and lower surfaces. When a predetermined drive voltage is applied to the LED chip 3, light is emitted from the upper surface 30 and the side surfaces 31. The upper surface 30 and the lower surface are formed with electrodes (not shown). The LED chip 3 is bonded on a first conductor 2a provided at the base plate 1, so that the electrode formed on the lower surface of the LED chip 3 is electrically connected to the first conductor 2a. The electrode formed on the upper surface 30 is electrically connected to a second conductor 2b via a wire W. The first and second conductors 2a, 2b extend from the upper surface to the lower surfaces of the base plate 1, and the portions at the lower surface of the base plate 1 serve as terminals 2a', 2b' for surface mounting.

In the prior art shown in FIG. 8, the semiconductor chip 103 is placed in a manner such that each of the side surfaces 103a of the chip 103 is parallel to the directions x or y. Differing from this, in the present embodiment as shown in FIG. 2, the LED chip 3 is placed in a manner such that one diagonal line 32a at the upper surface is parallel to the direction x, while the other diagonal line 32b is parallel to the direction y. With such an arrangement, each of the side surfaces 31 is non-parallel (inclined at 45° relative to the direction x and the direction y) to both of the direction x and the direction y. The side surfaces 31 are arranged in parallel to the direction z.

The reflector 5 is a rectangular frame elongated in the direction x for defining a space 51 in which the LED chip 3 and the light-permeable member 6 are accommodated. The reflector 5 includes a pair of inner surfaces (first reflecting surfaces) 50a and another pair of inner surfaces (second reflecting surfaces) 50b. Each of the first reflecting surfaces 50a is spaced, across the LED chip 3, from each other in the direction x, and is parallel to the direction y. Each of the second reflecting surfaces 50b is spaced, across the LED chip 3, from each other in the direction y, and is parallel to the direction x. The reflector 5 is made of a whitish resin of polycarbonate containing titanium oxide. In this way, the first and the second reflecting surfaces 50a, 50b are made to be white surfaces having high optical reflectivity. The reflector 5 may also be made of liquid crystal polymer or of polyamide resin, for example.

The first reflecting surfaces 50a and the second reflecting surfaces 50b are both inclined surfaces facing upward. The inclination angles (relative to the direction z) of the surfaces are different from each other, as shown in FIGS. 3 and 4. For example, the inclination angle of the first reflecting surface 50a is 45°, while the inclination angle of the second reflecting surface is smaller than 45°. As shown in FIG. 2, the maximal length L1 of the second reflecting surface 50b is longer than the maximal length L2 of the first reflecting surface 50a. Each of the side surfaces 31 of the LED chip 3 faces to an adjacent second reflecting surface 50b with an inclination of 45° (in a non-parallel posture), as viewed in a plane or, in other words, viewed parallel to the direction z.

The light-permeable member 6 is made of e.g. transparent epoxy resin, and is accommodated in the space 51 of the reflector 5 to cover the LED chip 3 and the wire W. The light-permeable member 6 can be formed by filling the space 51 with fluid epoxy resin and then solidifying the same.

Next, functions of the optical semiconductor device A1 is described below.

On light emission from the LED chip 3, light is emitted from the four side surfaces 31. As described above, each of the side surfaces 31 faces a corresponding second reflecting surface 50b in a non-parallel manner as viewed parallel to the direction z. With this arrangement, as shown in FIG. 2, the light emitted from each side surface 31 is reflected at the second reflecting surface 50b and then travels toward the first reflecting surface 50a, or travels directly toward the first reflecting surface 50a. The light directed to the first reflecting surface 50a is then reflected upward at the first reflecting surface to irradiate an illuminated area placed above the optical semiconductor device A1.

As described above, the light emitted from the side surfaces 31 is directed to the first reflecting surface 50a directly or indirectly. Therefore, differing from the structure shown in FIG. 12, the light is prevented from repeated reflection at the pair of second reflecting surfaces 50b. As a result, the optical semiconductor device A1 can avoid attenuation of the light emitted from the LED chip, thereby increasing the amount of the light directed to the illuminated area.

Each of the four side surfaces 31 of the LED chip 3 is inclined at the same angle (45°) relative to an adjacent second reflecting surface 50b. Thus, the light emission from every side surfaces 31 can be guided under similar conditions to the first reflecting surface 50a by the second reflecting surface 50b. As seen from FIG. 2, the LED chip is placed at an equal distance from each of the two first reflecting surfaces 50a. Thus, the same amount of light can be directed to each of the two first reflecting surfaces 50a. As described above, part of the light emitted from the side surfaces 31 of the LED chip 3 directly travels toward the first reflecting surface 50a. This direct light is not attenuated by the second reflecting surfaces 50b, and thus is efficiently reflected upward to the illuminated area by the first reflecting surface 50a. The light emitted upward from the upper surface 30 of the LED chip 3 travels directly toward the illuminated area.

Figure 5:
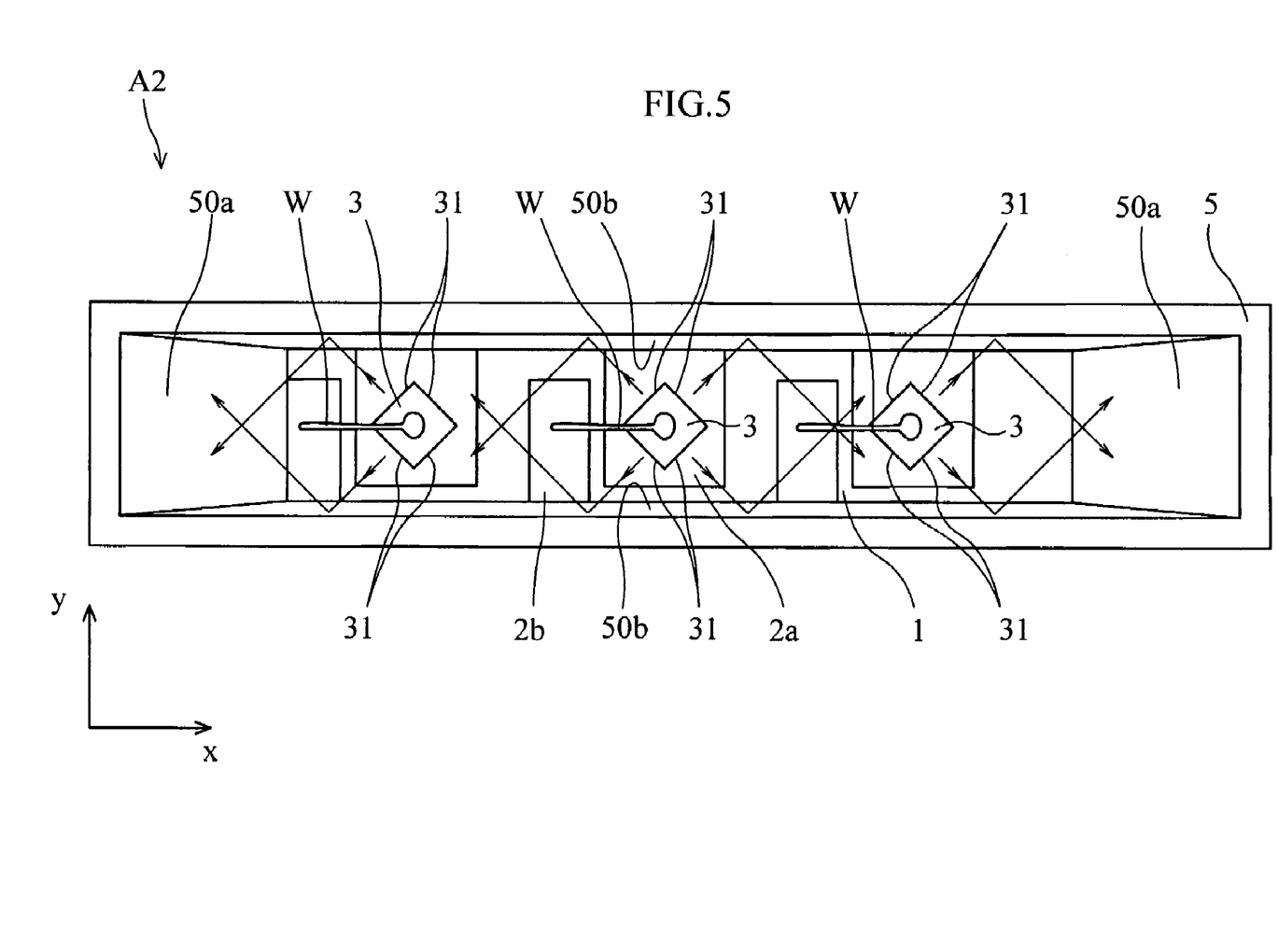
FIG. 5 is a plan view illustrating an optical semiconductor device according to a second embodiment of the present invention.
Figure 6A:
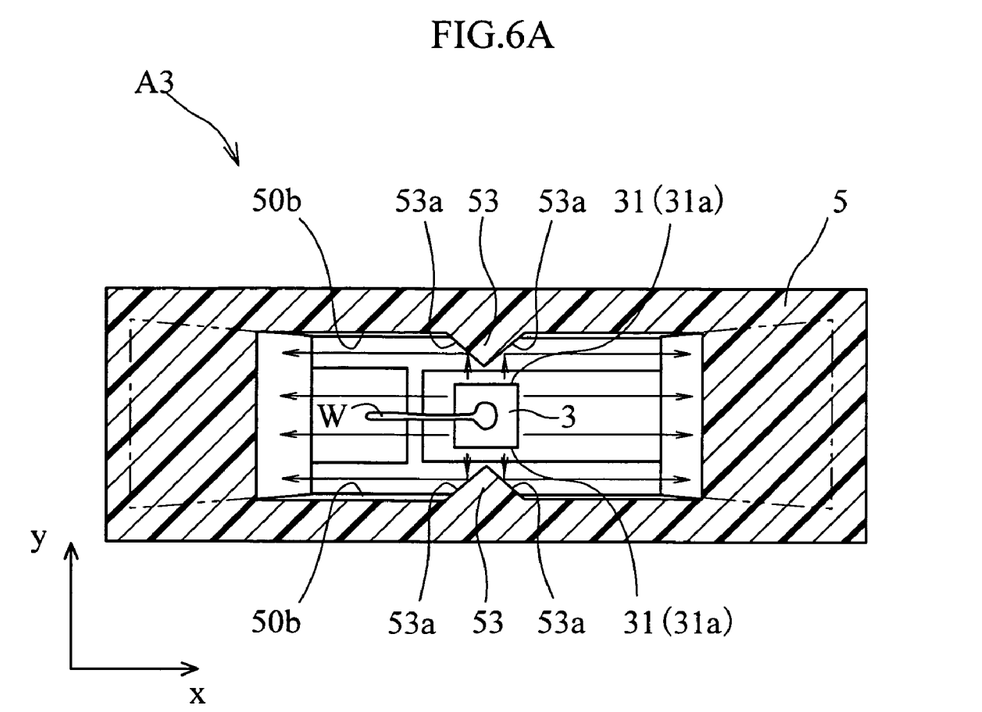
FIG. 6A is a plan view illustrating a section of an optical semiconductor device according to a third embodiment of the present invention.
Figure 6B:
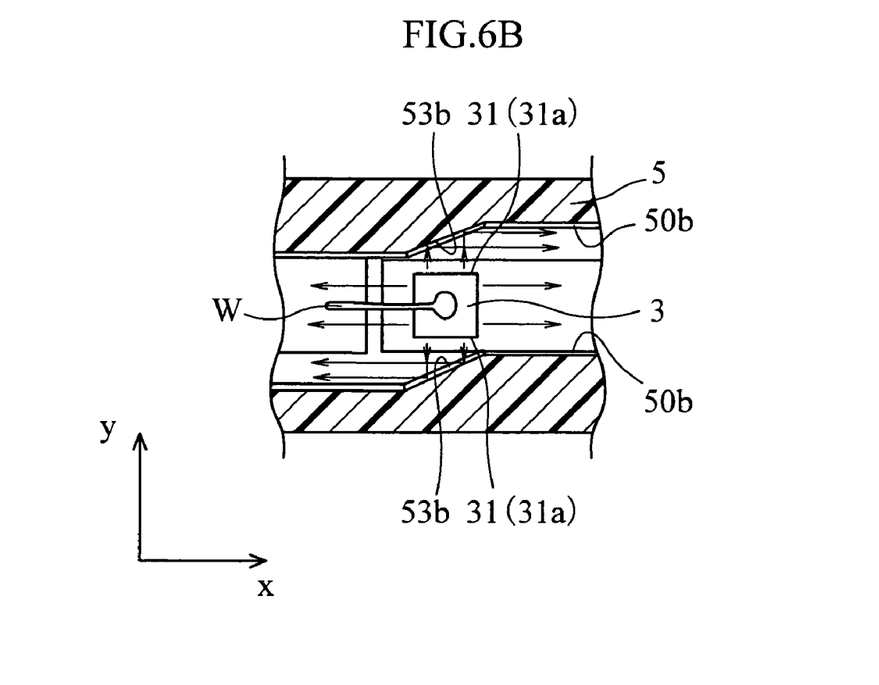
FIG. 6B is a plan view illustrating a principal part of a modified example of the optical semiconductor device shown in FIG. 6A.

FIGS. 5 and 6 illustrate optical semiconductor devices according to other embodiments of the present invention. In these figures, elements identical or similar to those in the above-described first embodiment are given the same reference numbers.

FIG. 5 illustrates an optical semiconductor device A2 according to a second embodiment of the present invention. The optical semiconductor device A2 includes three LED chips 3 accommodated in the reflector 5. These LED chips 3 are aligned and spaced from each other in the direction x, and every one of them is arranged the same as the LED chip shown in FIG. 2 (specifically, the side surfaces 31 are inclined at 45° relative to the x axis and the y axis).

This structure can also make the light, that is emitted from the side surfaces 31 of the LED chips 3 and travels toward the second reflecting surface 50b, to be guided to the first reflecting surface 50a, and to be upwardly reflected at the first reflecting surfaced 50a to above the optical semiconductor device A2. The LED chips 3 may emit light of a same color, or of different colors (R, G, B). The LED chips 3 may also drive at the same time, or only one or two selected chips may drive at a time.

FIG. 6A illustrates an optical semiconductor device A3 according to third embodiment of the present invention. In the optical semiconductor device A3, each of the side surfaces 31 of the LED chip 3 is arranged parallel to any one of the directions x and y (and parallel to the direction z). Each of the second reflecting surfaces 50b of the reflector 5 is formed with a projection 53 protruding toward the LED chip 3. The projection 53 faces one side surface (one of the two side surfaces 31a spaced from each other in the direction y) of the LED chip 3. The projection 53 is triangular in section and includes a pair of walls (reflecting surfaces) 53a for light reflection. Each of the reflecting surfaces 53a is parallel to the direction z, while non-parallel to both of the directions x and y. The reflecting surfaces 53a are inclined relative to the direction x at 45°, for example. Thus, the reflecting surfaces 53a are non-parallel to the side surfaces 31a that are parallel to the directions x and y.

Due to this structure, the light emitted from the side surfaces 31a of the LED chip 3 in the direction y is reflected by the inclined surfaces 53a in the direction x, and is guided to the first reflecting surfaces 50a. Therefore, the present embodiment can also avoid attenuation of the light due to the repeated reflection at the pair of second reflecting surfaces 50b.

FIG. 6B illustrates a modified example of the structure shown in FIG. 6A. Each of the second reflecting surfaces 50b is not formed with the projection, but is formed uneven to have a pair of inclined surfaces 53b inclined relative to the directions x and y (while the inclined surfaces 53b are parallel to the direction z). The inclined surfaces 53b are inclined relative to the direction x at 45°, for example. Thus, the inclined surfaces 53b are non-parallel to the facing side surfaces 31a. This structure can also make the light, that is emitted from the side surfaces 31a of the LED chip 3, to be reflected at the inclined surfaces 53b toward the first reflecting surfaces 50a. The light emitted from the LED chip 3 is reflected at one of the inclined surfaces 53b in a direction that is opposite to the direction of the light reflected at the other inclined surface. Referring to FIG. 6B, the light is reflected to the right side by the upper inclined surface 53b, while being reflected to the left side by the lower inclined surface 53b.

In the present invention as seen from FIGS. 6A and 6B, instead of the optical semiconductor chip inclined relative to the direction x or y, the second reflecting surfaces of the reflector may be partly formed with inclined surfaces for light reflection toward the first reflecting surfaces 50a. In other words, in the present invention, it suffices if the light emitting side surfaces of the optical semiconductor chip are non-parallel, as viewed in a plane, relative to the second reflecting surfaces (or relative to a part of them) facing the light emitting surfaces. Further, the second reflecting surfaces may not necessarily be formed with inclined surfaces only partly, but may be formed as inclined surfaces as a whole.

In the present invention, the reflector is not necessarily made of a white synthetic resin. If not, the first and the second reflecting surfaces of the reflector may be a metal film, having high optical reflectivity, formed by sputtering or vapor deposition. The first and the second reflecting surfaces may be curved surfaces, not plane surfaces.

In the present invention, the first reflecting surfaces 50a need to be inclined at an angle of certain degrees relative to the direction z, so that the light reflected at the second reflecting surfaces 50b is reflected here in the direction z. The second reflecting surfaces 50b are for reflecting the light from the optical semiconductor chip toward the first reflecting surfaces 50a. Thus, the second reflecting surfaces 50b may be parallel to (inclined at 0° relative to) the direction z. In this case, the upper sides and the lower sides of the first reflecting surfaces 50*a* are the same in length, and the first reflecting surfaces 50*a* are not trapezoidal but rectangular (or square).

The optical semiconductor chip is not limited to a LED chip, but may be designed otherwise. The optical semiconductor device according to the present invention may emit e.g. infra red light instead of visible light. Further, in the present invention, the upper and the lower surfaces of the optical semiconductor chip may be rectangular, not square. When the side surfaces of the optical semiconductor chip are inclined relative to the directions x and y, the inclined angle may preferably be 45°, though not limited to this.

The invention claimed is:

1. An optical semiconductor device comprising:
   a light reflector comprising two first reflecting surfaces spaced from each other in direction x and two second reflecting surfaces spaced from each other in direction y perpendicular to the direction x; and
   at least one optical semiconductor chip arranged between the two first reflecting surfaces and also between the two second reflecting surfaces;
   wherein the optical semiconductor chip comprises a rectangular upper surface and a rectangular lower surface spaced to each other in direction z perpendicular to both of the directions x and y, the optical semiconductor chip further comprising at least one light-emitting side surface extending between the upper surface and the lower surface,
   wherein the first reflecting surfaces are inclined relative to the direction z at a first inclination angle, so that light emitted from the optical semiconductor chip is reflected in the direction z, and the second reflecting surfaces are inclined relative to the direction z at a second inclination angle smaller than the first inclination angle,
   wherein the second inclination angle of the second reflecting surfaces is 0°, and the first reflecting surfaces are rectangular,
   wherein the light-emitting side surface of the optical semiconductor chip faces one of the second reflecting surfaces and is non-parallel to the facing second reflecting surface as viewed parallel to the direction z;
   wherein the first inclination angle and the second inclination angle are selected such that light emitted from the light-emitting side surface of the optical semiconductor chip and reflected on the facing second reflecting surface is directed toward and reflected upward by one of the first reflecting surfaces.

2. The optical semiconductor device according to claim 1, wherein the light-emitting side surface of the optical semiconductor chip is non-parallel to both of the directions x and y.

3. The optical semiconductor device according to claim 1, wherein the light-emitting side surface of the optical semiconductor chip is inclined relative to the direction x at 45°.

4. The optical semiconductor device according to claim 1, wherein said one of the two second reflecting surfaces is non-parallel to both of the directions x and y.

5. The optical semiconductor device according to claim 1, wherein the reflector is a rectangular frame elongated in the direction x longer than in the direction y.

6. The optical semiconductor device according to claim 1 further comprising a second optical semiconductor chip arranged between the two first reflecting surfaces and also between the two second reflecting surfaces, wherein said one optical semiconductor chip and the second optical semiconductor chip are spaced from each other in the direction x.

7. The optical semiconductor device according to claim 1 further comprising a base plate for mounting the optical semiconductor chip and the reflector, wherein a wiring pattern is formed on the base plate and is electrically connected to the optical semiconductor chip.

8. The optical semiconductor device according to claim 1, wherein each of the upper surface and the lower surface of the optical semiconductor chip is square and the optical semiconductor chip includes four rectangular light-emitting surfaces extending between the upper and the lower surfaces, wherein one of two diagonals of the upper surface of the optical semiconductor chip is parallel to the direction x, while the other diagonal is parallel to the direction y.

9. The optical semiconductor device according to claim 8, wherein the light emitted from the four light-emitting surfaces is partly reflected by the second reflecting surfaces and then travels toward the first reflecting surfaces, while partly traveling directly to the first reflecting surfaces.

10. The optical semiconductor device according to claim 1, wherein each of the second reflecting surfaces is provided with a projection projecting toward the light-emitting side surface of the semiconductor chip.

11. The optical semiconductor device according to claim 1, wherein each of the second reflecting surfaces includes a main portion extending in parallel to the direction x and an intermediate portion facing the light-emitting side surface of the semiconductor chip inclined with respect to the directions x and y.

* * * * *